US010235058B2

United States Patent
Harrand et al.

(10) Patent No.: US 10,235,058 B2
(45) Date of Patent: Mar. 19, 2019

(54) SYSTEM AND METHOD FOR MANAGING WEAR OF AN ELECTRONIC MEMORY

(71) Applicant: Commissariat à l'Énergie Atomique et aux Énergies Alternatives, Paris (FR)

(72) Inventors: Michel Harrand, Saint Egreve (FR); Elisa Vianello, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 15/103,259

(22) PCT Filed: Dec. 12, 2014

(86) PCT No.: PCT/EP2014/077653
§ 371 (c)(1),
(2) Date: Jun. 9, 2016

(87) PCT Pub. No.: WO2015/086847
PCT Pub. Date: Jun. 18, 2015

(65) Prior Publication Data
US 2016/0313929 A1    Oct. 27, 2016

(30) Foreign Application Priority Data

Dec. 12, 2013 (FR) .................................. 13 62471

(51) Int. Cl.
*G06F 3/06*     (2006.01)
*G06F 12/02*    (2006.01)
*G11C 13/00*    (2006.01)
*G11C 16/34*    (2006.01)

(52) U.S. Cl.
CPC .......... *G06F 3/0616* (2013.01); *G06F 3/0629* (2013.01); *G06F 3/0679* (2013.01);
(Continued)

(58) Field of Classification Search
CPC ......... G06F 12/0246; G06F 2212/7211; G06F 3/0629; G06F 3/0679; G06F 12/0238;
(Continued)

(56) References Cited

U.S. PATENT DOCUMENTS 6,320,778 B1   11/2001  Tanaka
7,913,032 B1 *  3/2011  Cornwell ............ G06F 12/0246
                                                      711/103
(Continued)

FOREIGN PATENT DOCUMENTS

EP           1345234 A1    9/2003
WO    WO 2011/133139 A1   10/2011

OTHER PUBLICATIONS

International Search Report, dated Oct. 8, 2015, from corresponding International Application No. PCT/EP2014/077653.
(Continued)

*Primary Examiner* — Rocio Del Mar Perez-Velez
*Assistant Examiner* — Zubar Ahmed
(74) *Attorney, Agent, or Firm* — Wolf, Greenfield & Sacks, P.C.

(57) ABSTRACT

A system including: a memory including a plurality of pages; and a control circuit suitable for delivering user access to the memory and for implementing a balancing method for the wear of the memory, including movement of data within the memory, in which the control circuit is suitable for delivering, between the first and second consecutive page read or write operations of the wear balancing method and between the second and a third consecutive page read or write operation of the wear balancing method, one or more user accesses to the pages of the memory.

17 Claims, 4 Drawing Sheets (52) U.S. Cl.
CPC ...... *G06F 12/0238* (2013.01); *G06F 12/0246* (2013.01); *G11C 13/0002* (2013.01); *G11C 13/0035* (2013.01); *G11C 13/0069* (2013.01); *G11C 13/0097* (2013.01); *G11C 16/3495* (2013.01); *G06F 2212/1036* (2013.01); *G06F 2212/7211* (2013.01)

(58) Field of Classification Search
CPC ........... G06F 2212/1036; G06F 3/0616; G11C 13/0002; G11C 13/0035; G11C 16/3495; G11C 13/0097; G11C 13/0069
See application file for complete search history.

(56) References Cited

U.S. PATENT DOCUMENTS

| | | | |
|---|---|---|---|
| 8,601,202 B1* | 12/2013 | Melcher | G11C 16/349 711/103 |
| 2004/0022085 A1 | 2/2004 | Parkinson | |
| 2004/0047228 A1 | 3/2004 | Chen | |
| 2009/0100290 A1* | 4/2009 | Nakanishi | G11C 11/5628 714/5.1 |
| 2010/0058018 A1 | 3/2010 | Kund et al. | |
| 2010/0281202 A1* | 11/2010 | Abali | G06F 12/0246 711/103 |
| 2013/0235649 A1* | 9/2013 | Lindstadt | G11C 13/0035 365/148 |
| 2014/0137128 A1* | 5/2014 | Chang | G06F 9/4881 718/103 |
| 2014/0185360 A1 | 7/2014 | Kawai et al. | |
| 2014/0189284 A1* | 7/2014 | Hyuseinova | G06F 12/0238 711/206 |

OTHER PUBLICATIONS

Written Opinion, dated Oct. 8, 2015, from corresponding International Application No. PCT/EP2014/077653.

* cited by examiner

SYSTEM AND METHOD FOR MANAGING WEAR OF AN ELECTRONIC MEMORY

CROS-REFFERENCE TO RELATED APPLICATIONS

This application is the national phase of International Application No. PCT/EP2014/077653, filed on Dec. 12, 2014, which claims priority to French patent application 13/62471, filed on Dec. 12, 2013, both of which applications are hereby incorporated by reference to the maximum extent allowable by law.

BACKGROUND

The present application generally relates to the field of electronic memories, and more specifically aims at the managing of the wear in a memory.

DISCUSSION OF THE RELATED ART

In the present application, terms memory, memory device, or electronic memory are used to designate a device comprising a plurality of elementary storage cells, where each cell can be programmed to store one or a plurality of data bits (one bit if the storage element of the cell can take two different states, and a plurality of bits if the storage element of the cell can take more than two different states). In practice, a memory may contain a very large number of elementary cells, typically from several millions to several hundred billions.

So-called resistive memories, that is, memories where each elementary storage cell comprises an element having a resistance which can be modified by being applied a bias voltage, are here more specifically considered. Among the most common resistive memories, one may especially mention:

phase change memories, generally called PCM in the art, where the resistive element is formed by means of a material having a crystalline state, and accordingly a resistivity, capable of being changed, by varying its temperature during a write operation;

conductive bridge random access memories, generally designated with acronym CBRAM in the art, where the resistive element is formed by means of an insulating material where a conductive filament may be created or suppressed by application of a bias voltage; and oxide-based resistive random access memories, generally designated with acronym OxRRAM in the art, where the resistive element is also formed by means of an insulating material where a conductive filament may be created or suppressed by application of a bias voltage.

Resistive memories are non-volatile memories, that is, they may keep the data that they contain even in the absence of an electric power supply. They further have good performances in terms of speed and of electric power consumption, for example, performances of the same order of magnitude, or even greater than those of volatile capacitive memories called DRAM ("Dynamic Random Access Memory"), which are widely used in many electronic systems. Further, resistive memories have a relatively low bulk, and particularly a lower bulk than DRAMs (for an identical data storage capacity).

In many electronic systems, it would be advantageous to be able to replace DRAM-type memories with resistive memories, to take advantage, in particular, of the non-volatility and of the high density of resistive memories.

However, a problem which is posed is that the elementary cells of resistive memories have a relatively low lifetime or endurance as compared with DRAMs. As an illustrative example, the maximum number of cycles, that is, the maximum number of read or write operations, that an elementary cell of a resistive memory can typically withstand is in the order of 108, while this number is almost infinite for a DRAM.

Thus, to be able to use resistive memories in applications implementing frequent memory accesses, for example, as a RAM in a computer, a tablet, a smartphone, etc., mechanisms for controlling the wear of the memory, enabling to increase the lifetime, should be provided.

SUMMARY

Thus, an embodiment provides a system comprising: a memory comprising a plurality of pages; and a control circuit capable of performing user accesses to the memory and of implementing a method of managing the wear of the memory, wherein the control circuit is capable of performing, between first and second consecutive operations of reading from or writing into a page of the wear management method, and between the second operation and a third consecutive operation of reading from or writing into a page of the wear management method, one or a plurality of user accesses to pages of the memory.

According to an embodiment, the system further comprises intermediate data storage elements, the control circuit being capable, on implementation of the wear management method, of temporarily storing memory data into said storage elements and, when a user access in read or write mode occurs, of verifying whether the data targeted by the user are contained in said storage elements and, if they are, of processing the user access directly in said storage elements.

According to an embodiment, the system comprises a counter or a table enabling the control circuit to know which addresses in the memory are being processed by the wear management method.

According to an embodiment, the wear management method is a wearing balancing method comprising data displacements resulting in modifying the physical address of the data within the memory.

According to an embodiment, the intermediate storage elements comprises first and second registers, each capable of storing the content of a memory page.

According to an embodiment, the intermediate storage elements are volatile storage elements.

According to an embodiment, the control circuit periodically inserts wear management cycle between memory cycles reserved to the user accesses, with the possibility of performing a read operation or a write operation of the wear management method at each wear management cycle.

According to an embodiment, the control circuit is capable of performing the user accesses and the operations of reading from or writing into a page of the wear management method via a same access port of the memory.

According to an embodiment, the control circuit is configured so that the consecutive read or write operations of the wear balancing method are separated two by two by time intervals having the same duration.

According to an embodiment, in each of said time intervals, from fifty to ten thousand user accesses to memory pages may be performed.

According to an embodiment, the memory comprises a plurality of portions of a plurality of pages each, and the system comprises first and second tables capable of each storing as many 2-bit entries as a memory portion comprises pages.

According to an embodiment, the system further comprises a device capable of converting logic addresses, which are the addresses used by the user to access the content of the memory, into physical addresses, which are the addresses where the contents targeted by the user in the memory are effectively stored.

According to an embodiment, the address conversion device comprises at least one counter or register for tracking shifts of pages within the memory or a portion of the memory.

According to an embodiment, the memory is a resistive memory.

According to an embodiment, the control circuit comprises a first sub-circuit capable of implementing the wear balancing method, this sub-circuit being integrated with the memory on a same semiconductor chip.

According to an embodiment, the control circuit comprises a first sub-circuit capable of implementing the wear balancing method, this sub-circuit being integrated in a different integrated circuit chip than the memory According to an embodiment, the wear management method comprises a wear measurement method comprising: a first step of reading from a page having its wear desired to be measured; a second step of reading from said page with a threshold of discrimination between binary values '0' and '1' modified with respect to the first step; and a step of bit-to-bit comparison of the values read during the first and second reading steps.

Another embodiment provides a method of controlling a memory comprising a plurality of pages, comprising the steps of: implementing a method of balancing the wear of the memory comprising data displacements within the memory; and performing, between first and second consecutive operations of reading from or writing into a page of the wear balancing method, and between the second operation and a third consecutive operation of reading from or writing into a page of the wear balancing method, one or a plurality of user accesses to pages of the memory.

According to an embodiment, the user accesses and the operations of reading from or writing into a page of the wear balancing method are performed via a same access port of the memory.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the different drawings.

Further, only those elements which are useful to the understanding of the described embodiments have been shown and will be detailed hereafter. In particular, embodiments of systems comprising a memory and means for implementing methods of managing the wear of such a memory have been shown and will be detailed. However, the various uses which may be made of the memory of such systems have not been detailed, the described embodiments being compatible with current uses of such a memory.

Figure 1:
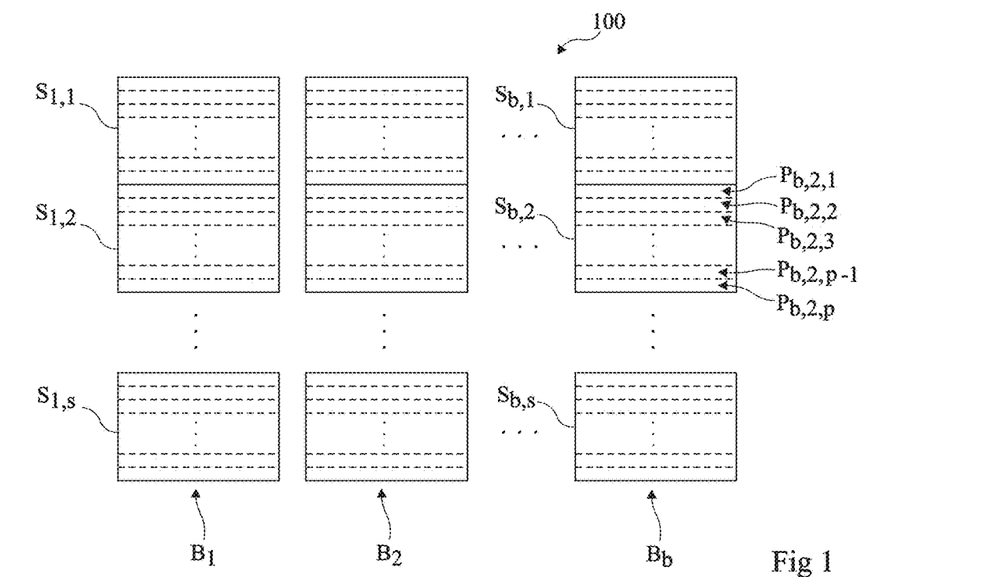
FIG. 1 schematically shows an example of organization or of layout of elementary data storage cells in a memory.

FIG. 1 schematically shows an example of layout of elementary data storage cells (not shown in the drawing) in a memory 100, for example, a resistive memory. In this example, the elementary cells 100 are distributed into a plurality of banks Bi, i being an integer from 1 to b and b being an integer greater than 1, the cells of each bank Bi are distributed into a plurality of segments Si,j, j being an integer in the range from 1 to s and s being an integer greater than 1, the cells of each segment Si,j are distributed into a plurality of lines or pages Pi,j,k, k being an integer in the range from 1 to p and p being an integer greater than 1, and the cells of each page Pi,j,k are distributed into a plurality of words Mi,j,k,1, 1 being an integer in the range from 1 to m and m being an integer greater than 1, of a plurality of elementary cells each. Each page Pi,j,k for example corresponds to the largest quantity of memory addressable in a single memory cycle, that is, the largest group of elementary cells which may be read from or written into in a single cycle in the memory. As a non-limiting illustration, memory 100 is a 32-gigabit memory, organized in 32 banks, each comprising 512 segments, each segment comprising 4,096 pages each comprising 16 words of 32 elementary cells (32 bits).

In practice, in most electronic systems using a memory, the distribution of the read and/or write accesses within the memory is very uneven. Indeed, certain data stored in the memory are used much more frequently than others. The memory portions containing the most frequently used data wear faster than the others, and their lifetime generally conditions the lifetime of the entire memory.

To increase the lifetime of a memory, it may be provided, when a memory portion has been written into more than a given number of times, to displace the data contained in this memory portion either within the actual portion, or to another memory portion. Such data displacements enable to better distribute the accesses to the physical memory cell, and thus to balance the wear of the memory and thus to increase the lifetime thereof. For such data displacements to be transparent for the memory user, a device of conversion of so-called logic addresses or user addresses, which are the addresses used by the user to access the memory, into so-called physical addresses, which are the addresses where the data having the user addresses pointing thereon are affectively physically stored, may be provided.

Figure 2A:
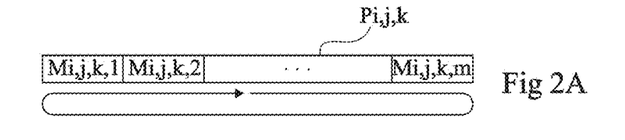
FIGS. 2A to 2F schematically illustrate examples of mechanisms or methods of managing the wear of a memory.

FIG. 2A schematically illustrates a first example of a wear management or balancing method which may be implemented in memory 100 of FIG. 1.

In this example, the accesses to each page Pi,j,k of the memory are counted and, when the number of accesses to a page Pi,j,k of the memory exceeds a threshold, an internal circular rotation of the data of this page is implemented, that is, the contents of words Mi,j,k,1 of the page are submitted to a circular rotation within the page. As an example, the content of the first word Mi,j,k,1 in the page is transferred into the second word Mi,j,k,2 in the page, the content of the second word Mi,j,k,2 in the page is transferred into the third word Mi,j,k,3 in the page, and so on until the last word Mi,j,k,m in the page having its content transferred into the first word Mi,j,k,1 in the page.

Figure 2B:
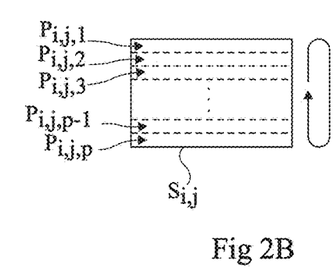

FIG. 2B schematically illustrates a second example of a wear management or balancing method which may be implemented in memory 100 of FIG. 1.

In this example, after a number of accesses to a segment $S_{i,j}$ in the memory, an internal circular rotation of the data of this segment is implemented, that is, the contents of pages $P_{i,j,k}$ of the segment are submitted to a circular rotation within the segment. As an example, the content of the first page $P_{i,j,1}$ in the segment is transferred into the second page $P_{i,j,2}$ in the segment, the content of the second page $P_{i,j,2}$ in the segment is transferred into the third page $P_{i,j,3}$ in the segment, and so on until the last page $P_{i,j,p}$ in the segment, which has its content transferred into the first page $P_{i,j,1}$ in the segment.

As an example, the accesses to each segment $S_{i,j}$ in the memory may be counted and, when the number of accesses to a segment $S_{i,j}$ in the memory exceeds a threshold, an internal circular rotation may be applied to this segment. As a variation, if the method of FIG. 2A is implemented, an internal circular rotation may be applied to a segment $S_{i,j}$ when a same page of this segment has been submitted to a number of internal circular rotations, for example, equal to the number of words in the page, that is, when the content of each word $M_{i,j,k,1}$ in the page has returned to the physical location that it used to occupy before the first internal circular rotation of the page.

Figure 2C:
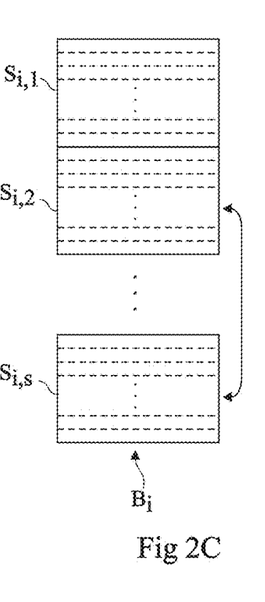

FIG. 2C schematically illustrates a third example of a wear management or balancing method which may be implemented in memory 100 of FIG. 1.

In this example, after a number of accesses to a memory segment $S_{i,j}$, the content of this segment is swapped with the content of another segment of the same memory bank $B_i$, for example, a segment having been submitted to a smaller number of accesses, for example, the segment of bank $B_i$ having been submitted to the smallest number of accesses.

As an example, the accesses to each segment $S_{i,j}$ in the memory may be counted and, when the number of accesses to a segment $S_{i,j}$ in the memory exceeds a threshold, a swapping of the content of this segment with the content of another segment of the same bank may be performed. As a variation, if the method of FIG. 2B is implemented, a swapping of the content of a segment $S_{i,j}$ with the content of another segment of the same bank may be performed when segment $S_{i,j}$ has been submitted to a number of internal circular rotations, for example, equal to the number of pages in the segment.

Figure 2D:
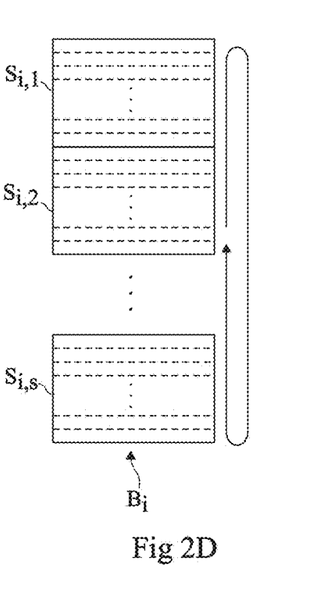

FIG. 2D schematically illustrates a fourth example of a wear management or balancing method which may be implemented in memory 100 of FIG. 1.

In this example, after a number of accesses to a bank $B_i$ of the memory, an internal circular rotation of the data of this bank is implemented, that is, the segments $S_{i,j}$ of the bank are submitted to a circular rotation within the bank. As an example, the content of the first segment $S_{i,1}$ in the bank is transferred into the second segment $S_{i,2}$ in the bank, the content of the second segment $S_{i,2}$ in the bank is transferred into the third segment $S_{i,3}$ in the bank, and so on until the last segment $S_{i,s}$ in the bank having its content transferred into the first segment $S_{i,1}$ in the bank.

As an example, the accesses to each bank $B_i$ in the memory may be counted and, when the number of accesses to a bank $B_i$ in the memory exceeds a threshold, this bank may be submitted to an internal circular rotation. As a variation, if the method of FIG. 2B is implemented within the memory segments, a bank $B_i$ may be submitted to an internal circular rotation when a same segment $S_{i,j}$ of this bank has been submitted to a number of internal circular rotations, for example, equal to the number of pages in this segment.

Figure 2E:
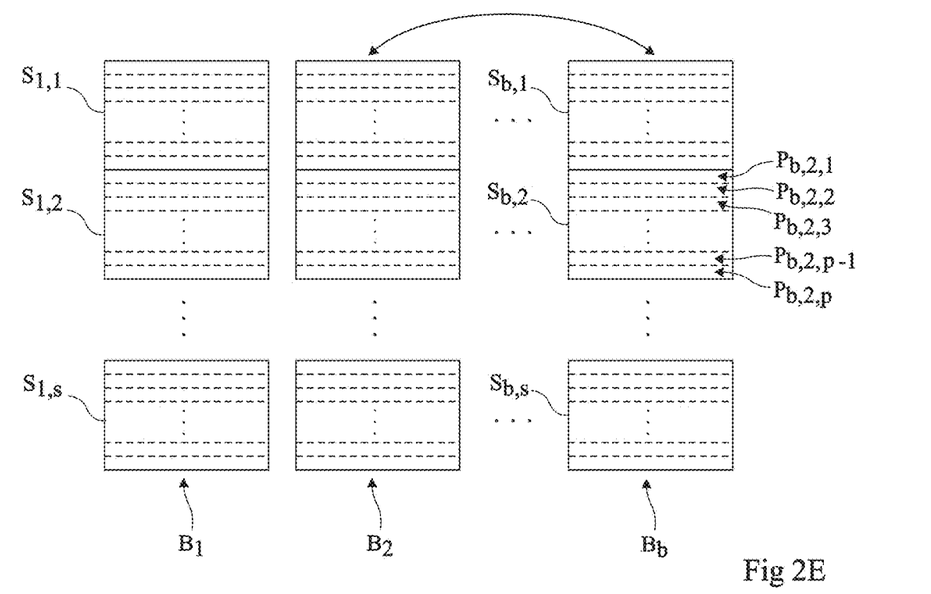

FIG. 2E schematically illustrates a fifth example of a wear management or balancing method which may be implemented in memory 100 of FIG. 1.

In this example, after a number of accesses to a memory bank $B_i$, the content of this bank is swapped with the content of another bank in the memory, for example, a bank having been submitted to a smaller number of accesses, for example, the memory bank having been submitted to the smallest number of accesses.

As an example, the accesses to each memory bank may be counted and, when the number of accesses to a bank $B_i$ in the memory exceeds a threshold, a swapping of the content of this bank with the content of another memory bank may be performed. As a variation, if the method of FIG. 2C or the method of FIG. 2D is implemented, a swapping of the content of a bank $B_i$ with the content of another bank may be performed when bank $B_i$ has been submitted to a number of internal swappings of segments (FIG. 2C) or of internal circular rotations (FIG. 2D), for example, equal to the number of segments in the bank.

Figure 2F:
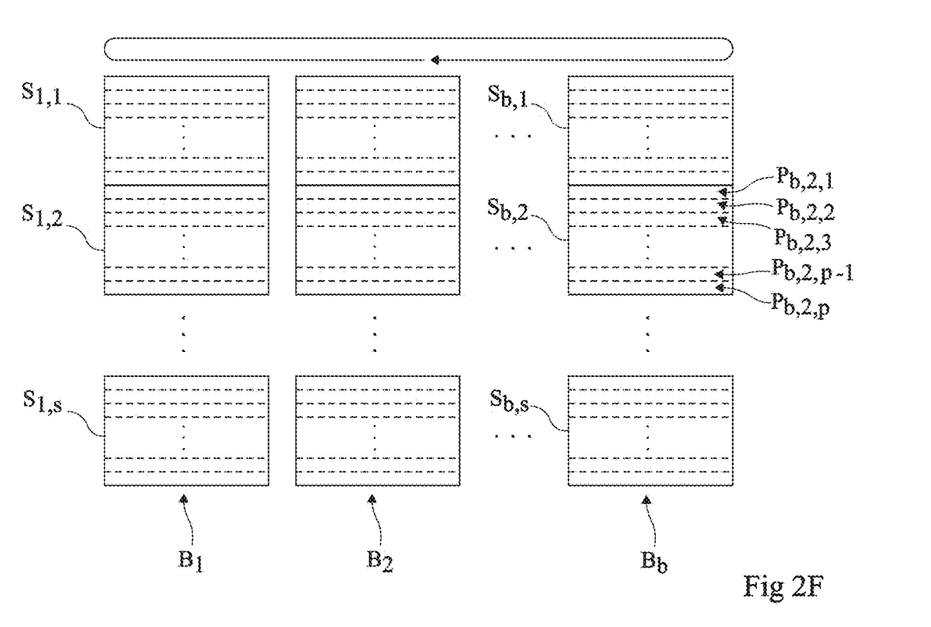

FIG. 2F schematically illustrates a sixth example of a wear management or balancing method which may be implemented in memory 100 of FIG. 1.

In this example, after a number of accesses to the memory, an internal circular rotation of the memory data is implemented, that is, banks $B_i$ are submitted to a circular rotation within the memory. As an example, the content of the first bank B1 is transferred into the second bank B2, the content of the second bank B2 is transferred into the third bank B3, and so on until the last bank Bb, which has its content transferred into first bank B1.

As an example, the accesses to the memory may be counted and, when the number of accesses to the memory exceeds a threshold, the memory may be submitted to an internal circular rotation. As a variation, if the method of FIG. 2C or the method of FIG. 2D is implemented, an internal circular rotation of the memory may be performed when a same bank $B_i$ in the memory has been submitted to a number of internal swappings of segments (FIG. 2C) or of internal circular rotations (FIG. 2D), for example, equal to the number of segments in the bank.

Figure 3:
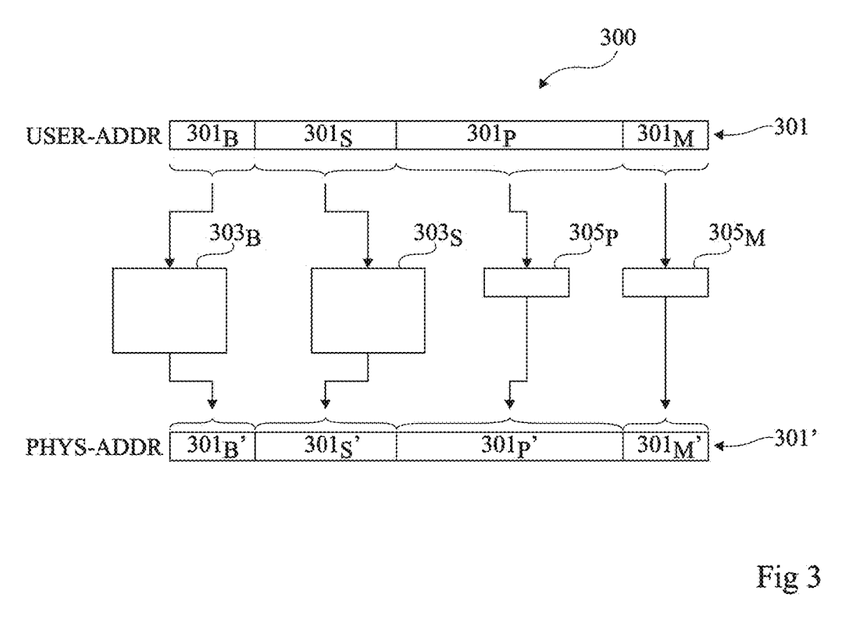
FIG. 3 schematically shows an embodiment of a memory addressing device capable of being used in a system implementing wear management methods of the type described in relation with FIGS. 2A to 2F.

FIG. 3 schematically shows an embodiment of a device 300 enabling, when a wear management method of the type described in relation with FIGS. 2A to 2F is implemented in memory 100 of FIG. 1, to convert logic addresses or user addresses, which are the addresses used by the user to access data in the memory, into so-called physical addresses, which are the addresses where the data are effectively physically stored in the memory. Device 300 especially enables, when a user accesses the memory via said device, to make data displacements internal to the memory, which result from the wear balancing method, transparent for the user.

In the example of FIG. 3, the case where the wear balancing method implements the mechanisms of FIGS. 2A, 2B, 2C, and 2E is considered as a non-limiting illustrative example.

Device 300 is capable of receiving a user address 301 (USER-ADDR) pointing to a word of memory 100 targeted by the user, and of providing a physical address 301' (PHYS-ADDR), corresponding to the real address at which the content of the targeted word is effectively stored.

User address 301 comprises a first subset of bits 301B defining the address of the bank where, for the user, the targeted content is supposed to be, that is, the address of the bank where the targeted content would effectively be if the wear balancing method was not implemented. User address 301 further comprises a second subset of bits 301S defining, within a bank, the address of the segment where, for the user, the targeted content is supposed to be, a third subset of bits 301P defining, within a segment, the address of the page where, for the user, the targeted content is supposed to be, and a fourth subset of bits 301M defining, within a page, the address of the word where, for the user, the targeted content is supposed to be.

Physical address 301' comprises a first subset of bits 301B' defining the address of the bank where the content of the word targeted by the user is effectively located. Physical address 301' further comprises a second subset of bits 301S' defining, within the bank, the address of the segment where the desired content is effectively located, a third subset of bits 301P' defining, within the segment, the address of the page where the desired content is effectively located, and a fourth subset of bits 301M' defining, within the page, the address of the word where the desired content is effectively located.

Device 300 comprises a first conversion element 303B, capable of converting the user address of bank 301B into the physical address of bank 301B'. In this example, conversion element 303B comprises a bank address translation table comprising b entries of log2(b) bits each, b being the number of memory banks. For each swapping of banks in the implementation of the wear balancing method of FIG. 2E, the new physical addresses 301B' of the swapped contents are updated in the table.

Device 300 further comprises a second conversion element 303B, capable of converting the user segment address 301S into the physical segment address 301S'. In this example, conversion element 303S comprises, for each bank in the memory, a segment address translation table comprising s entries of log2(s) bits each, s being the number of segments in the bank. For each swapping of segments in the implementation of the wear balancing method of FIG. 2C, the new physical addresses 301S' of the swapped contents are updated in the corresponding table.

Device 300 further comprises a third conversion element 305P, capable of converting the user page address 301P into the physical page address 301P'. In this example, conversion element 305P comprises, for each segment in the memory, a shift tracking register, containing the number of internal circular rotations undergone by the segment in the implementation of the wear balancing method of FIG. 2B. To determine physical address 301P' of the searched page, device 300 may add to the user page address 301P the value contained in the segment shift tracking register, modulo p, where p is the number of pages in the segment.

Device 300 further comprises a fourth conversion element 305M, capable of converting the user word address 301M into the physical address of word 301M'. In this example, conversion element 305P comprises, for each memory page, a shift tracking register, containing the number of internal circular rotations undergone by the page in the implementation of the wear balancing method of FIG. 2A. To determine physical address 301M' of the searched word, device 300 may add to the user word address 301M the value contained in the page shift tracking register, modulo m, where m is the number of words in the page.

The embodiments described in the present application are not limited to the specific example of address conversion device of FIG. 3. More generally, whatever the displacements of contents implemented in a memory to balance the wear thereof, an address conversion device enabling to convert user addresses into physical addresses may be provided, for example, by using address translation tables and/or shift tracking registers.

It would be desirable to be able to implement a wear management or balancing method implying displacements of contents within the memory, for example, methods of the type described in relation with FIGS. 2A to 2F, without for this to cause an extensive service interruption for the memory user, that is, without for the access to the memory to be uninterruptedly blocked for the user during data displacement phases of the wear management method.

Indeed, as an illustrative example, the swapping of the content of two segments of memory 100 of FIG. 1 requires 2*p read operations and 2*p write operations, where p is the number of pages in a segment. Considering the above-mentioned numerical example of a memory comprising 4,096 pages per segment and considering a memory having a page reading access time of 50 ns and a page writing access time of 50 ns, the time required to swap the content of two segments may be in the order of 2*2*4,096*50 ns=819 µs. In many applications, blocking the access to the memory with no interruption for such a time period raises an issue.

According to an aspect of the described embodiments, a system comprising a memory of a plurality of pages and a control circuit capable of implementing a wear management method comprising swappings of contents within the memory is provided, for example, a method of the type described in relation with FIGS. 2A to 2F, the control circuit being capable of interposing, between consecutive page reading or writing operations of the wear balancing method, one or a plurality of user accesses to memory pages.

"Consecutive read or write operations of the wear balancing method" here designates two page reading or writing steps of the wear balancing method which are not separated by another page reading or writing step of the wear balancing method, and "user access" designates a memory page read or write operation for any use other than the implementation of the wear balancing method.

In other words, in the provided system, the page reading or writing operations of the memory wear balancing method are spread in time, and separated from one another by time intervals during which user accesses may take place. Such a system enables the user to keep on accessing the memory during data displacement phases of the balancing method. This enables to make the wear balancing method practically transparent for the user in terms of memory access times. Indeed, in such a system, a user request to access the memory will be delayed at most by one memory cycle due to the implementation of the wear balancing method.

The page reading or writing operations of the wear balancing method and the user accesses may be performed successively by the control circuit via a same port of access to the memory. Access port here designates an assembly of input and/or output terminals capable of receiving an address signal, of receiving an input data signal, and of supplying an output data signal. An access port may in particular comprise an address input over a plurality of bits, capable of receiving a memory page address signal, a data input over a plurality of bits, capable of receiving a data signal to be written into a page of the memory, and a data output over a plurality of bits, capable of delivering a signal of data read from a memory page, with the possibility for the data input and the data output of being one and the same.

The number of user accesses between two consecutive read or write operations of the wear balancing method and/or the time interval separating two consecutive read or write operations of the wear balancing method may be constant or not. As a non-limiting example, the time interval separating two consecutive read or write operations of the wear balancing method is constant. The number of page reading or page writing accesses which may be performed within this time interval is for example in the range from a few tens to a few thousands, for example, between fifty and ten thousands.

It should be noted that in DRAMs, to avoid information losses, it is necessary to periodically refresh, that is, to read from, and then to identically rewrite into, each memory page. To achieve this, a system using a DRAM generally comprises a DRAM controller, that is, a circuit forming an interface between the DRAM and a user circuit, for example, a processor. The DRAM controller periodically inserts, between user accesses, refreshment cycles during which memory pages may be identically read from and rewritten into. In resistive memories, the data refreshment is not necessary. In a system comprising a resistive memory, it may for example be provided to separate two consecutive page reading or writing operations of the wear balancing method by a time interval identical or of the same order of magnitude as the time interval separating two consecutive refreshment cycles in a system comprising a DRAM.

As an example, the circuits implementing the wear balancing method may be integrated in the chip comprising the resistive memory. In this case, one may easily, in a standard DRAM system, replace the DRAM with a chip comprising the resistive memory, and keep a standard DRAM controller to form an interface between the memory chip and the user circuit. The refreshment cycles periodically inserted by the DRAM between user accesses are then used by the memory chip as wear balancing cycles, to implement a read or write step of the wear balancing method.

As a variation, the circuits implementing the wear balancing method may be integrated in the controller forming an interface between the memory chip and the user circuit, which enables to make the system compatible with memory chips where no wear balancing circuit is provided.

In other words, the control circuit may comprise at least two sub-circuits, a first sub-circuit capable of implementing the actual wear balancing method, and a second sub-circuit adapted to managing user accesses and the alternation of user accesses and of wear balancing cycles. The first sub-circuit may be either integrated in the actual memory chip or be outside of the memory chip, for example, in a chip integrating the first and second sub-circuits.

Figure 4:
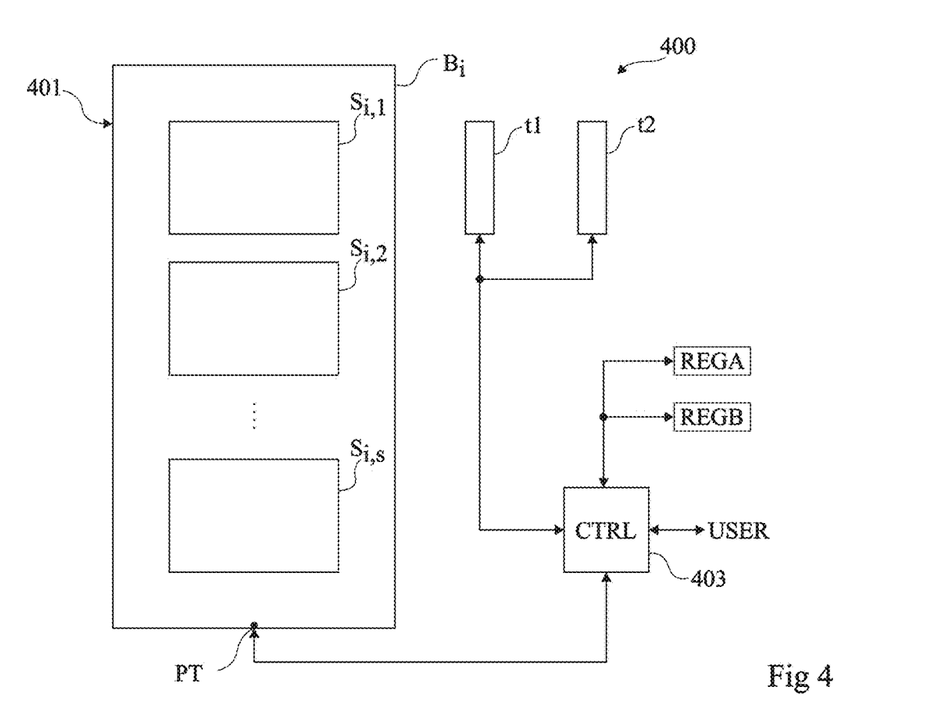
FIG. 4 schematically and partially shows an embodiment of a system comprising a memory and of means for implementing a method of managing the wear of this memory.

FIG. 4 schematically and partially shows an embodiment of a system 400 comprising a memory 401 and means for implementing a method of managing the wear of this memory.

Memory 401 for example has a logic organization identical or similar to that of memory 100 of FIG. 1. FIG. 4 shows a single bank Bi of memory 401. Memory 401 comprises at least one port PT enabling, at each memory cycle (memory 401 may be rated by a block, not shown), to read from or to write into a memory page. As an example, each bank Bi of memory 401 comprises an access port PT enabling, at each memory cycle, to access a page in the bank.

System 400 comprises a control circuit 403 (CTRL), for example comprising a specific cabled circuit, for example, a finite state machine, or a microcontroller. Circuit 403 is capable of receiving memory access requests from a user circuit (USER), and of processing such requests by accessing banks Bi of the memory via access ports PT. Circuit 403 is further capable of implementing, in parallel with the user accesses, a method of managing of balancing the wear of memory 401, comprising data displacements within a same segment or between different segments of a same bank or different banks, for example, a method of the type described in relation with FIGS. 2A to 2F. To perform the data displacements of the wear balancing method, circuit 403 accesses the memory via the same access ports PT as those used to perform the user accesses. To perform the data displacements of the wear management method, circuit 403 inserts, between user accesses, for example, periodically, wear balancing cycles. During each wear balancing cycle, a memory page may be read from or written into to implement the wear balancing method. Each wear balancing cycle is preceded and followed by a time interval during which user accesses to memory pages may be performed.

So that the data displacements implemented by the wear balancing method can be, in terms of addressing, transparent for the user, system 400 may comprise an address conversion device (not shown in FIG. 4) of the type described in relation with FIG. 3. The address conversion device may be updated by circuit 403 as the data displacements are being performed.

In the example of FIG. 4, system 400 comprises two tables t1 and t2, each comprising a number of entries or 2-bit values equal to page number $P_{i,j,k}$ contained by a segment $S_{i,j}$, that is, p 2-bit entries in this example. Further, system 400 comprises two registers REGA and REGB capable of each storing the content of a memory page $P_{i,j,k}$. Control circuit 403 is capable of reading from and writing into tables t1 and t2 and registers REGA and REGB. As a non-limiting example, tables t1 and t2 and registers REGA and REGB may be formed in a memory of different technology than that of memory 401, for example, in a memory having shorter access times than memory 401, for example, a SRAM (Static Random Access Memory).

When a data displacement internal to a segment is performed by circuit 403, circuit 403 may assign table t1 to the concerned segment $S_{i,j}$, and update table t1. For each page of segment $S_{i,j}$, table t1 indicates the state of the page among the following possibilities: the page content has not been transferred; or the page content is in register REGA (in the process of being transferred); or the page content is in register REGB (in the process of being transferred); or the page content has been transferred into another page.

As an example, to perform an internal circular rotation of a segment $S_{i,j}$ on implementation of the method of FIG. 2B, circuit 403 may for example, at each wear balancing cycle, implement one of the steps of the following method:

reading the content of the first page $P_{i,j,1}$ of segment $S_{i,j}$, writing this content into register REGA, and updating table t1 for this page;

reading the content of the second page $P_{i,j,2}$ of segment $S_{i,j}$, writing this content into register REGB, and updating table t1 for this page;

writing the content of register REGA into the second page $P_{i,j,2}$ of the segment and updating table t1 for page $P_{i,j,1}$;

reading the content of the third page $P_{i,j,3}$ of segment $S_{i,j}$, writing this content into REGA, and updating table t1 for this page;

writing the content of register REGB into the third page $P_{i,j,3}$ of the segment and updating table t1 for page $P_{i,j,2}$;

and so on until the transfer of the content of the last page $P_{i,j,p}$ of the segment into the first page $P_{i,j,1}$.

More generally, methods of the same type may be implemented by circuit 403 to displace data either within a same segment $S_{i,j}$ or between different memory segments, whatever the envisaged displacements (circular rotation of the words in the page—FIG. 2A, circular rotation of the pages in the segment—FIG. 2B, swapping of segments within a bank—FIG. 2C, circular rotation of segments within a bank—FIG. 2D, bank swapping—FIG. 2E, circular rotation of the memory banks—FIG. 2F, or others). When a displacement of page contents between first and second different segments is performed, circuit 403 may assign table t1 to the first segment and assign table t2 to the second segment, and keep tables t1 and t2 updated. Tables t1 and t2 indicate the state (transferred, non-transferred, or in the process of being transferred) of each of the pages of each of the two concerned segments. Displacements comprising a plurality of swappings of segment contents within a same bank may be performed sequentially. Optionally, for example, to perform a circular rotation of segments within a bank, the system may comprise an additional buffer memory of the size of a segment, for example, formed in a SRAM. Further, the system may optionally comprise an additional memory having the size of a bank, for example, a resistive memory, for example, to perform a circular rotation of the memory banks.

If a user access occurs in a segment $S_{i,j}$ while an ongoing data displacement affects this segment, circuit 403 may consult table t1 or t2 assigned to the segment to know:

whether the content of the targeted page has already been transferred, in which case the data are read from or written at their new address in the memory;

whether the content of the targeted page is in register REGA or in register REGB, in which case the data are read from or written into register REGA or REGB; or whether the content of the targeted page has not been transferred, in which case the data are read from or written at their original address in segment $S_{i,j}$.

System 400 of FIG. 4 enables to implement a wear management or balancing method implying displacements of contents within the memory, such displacements being, for the user, transparent in terms of addressing of the data and practically transparent in terms of the times of access to the memory content.

In the embodiments of FIG. 4, if the memories used to form tables t1 and t2, registers REGA and REGB, as well as other data storage elements useful to implement the wear balancing method (memory access counters, tables of translation of user addresses into physical addresses, displacement tracking registers, etc.) are volatile memories, for example, made in SRAM technology, it may be provided, at the system powering-off, to transfer the data contained in the various storage elements into a non-volatile memory to avoid losing these data.

Specific embodiments have been described. Various alterations, modifications, and improvements will readily occur to those skilled in the art.

In particular, the described embodiments are not limited to the above-mentioned examples of logic organization of the elementary cells in a memory or to the above-mentioned examples of data displacements in the memory to balance the wear thereof.

More generally, whatever the logic internal organization of the memory, and whatever the data displacements envisaged to balance the memory wear, it will be within the abilities of those skilled in the art, based on the above-described teachings, to form a system where data displacements of the wear balancing method are performed during wear management cycles inserted between user accesses.

Further, the described embodiments are not limited to the specific example described in relation with FIG. 4 of means enabling to perform the data displacements of the wear balancing method and to manage user accesses, in particular when data are being displaced in the context of the wear balancing method. It should in particular be noted that when the wear balancing method comprises circular rotations of data within a page, for example, of the type described in relation with FIG. 2A, the system may comprise one or a plurality of specific circuits capable of performing a circular shift of the content of a page during a read or write cycle in the main memory.

Further, the described embodiments are not limited to the above-mentioned examples of resistive material technologies. More generally, the described embodiments are compatible with all technologies of resistive or non-resistive memories subject to wearing.

Further, embodiments where a wear balancing method comprising data displacements within the memory is implemented, each read or write step of the wear balancing method being followed by one or a plurality of user accesses, have been described. The described embodiments however also aim at wear management methods comprising no data displacements within the memory, that is, which do not result in modifying the physical location of the data in the memory. As an example, the described embodiments are compatible with a wear management method comprising operations of refreshment of the data contained in pages of the memory. Such a refreshment operation for example comprises a step of reading the data contained in a memory page, followed by a step of rewriting the read data at the same memory address. In this case, it is provided, similarly to what has been described hereabove, to interpose one or a plurality of user accesses between the read step and the write step of a same refreshment cycle. More generally, the described embodiments are compatible with all types of wear management methods comprising read and/or write accesses to the data stored in the memory.

Further, embodiments where, to estimate the wear of a memory portion and to accordingly decide whether to implement or not a wear management method targeting this portion, the read and/or write accesses to the memory portion are counted, have been described. The described embodiments are however not limited to this specific case. More generally, any other method enabling to measure or to estimate the wear of a resistive memory portion may be used to decide of the planning of the wear management methods.

Such wear measurement methods may for example be implemented by control circuit 403 of FIG. 4, or by any other adapted circuit. The different read and/or write steps of the wear measurement methods may be implemented during cycles dedicated to wear management, and thus be separated two by two by user accesses.

Moreover, to further extend its lifetime, the memory may comprise a stock of redundant cells provided on design of the circuit, that is, cells unused at the beginning of the memory life cycle and intended to replace cells having reached a critical wear threshold after a certain time of use. Wear management methods may, when a word or a page reaches a critical wear threshold, replace the worn-out word or page with a "new" word or page from the redundant cell stock.

As an example, the wear of a resistive memory page may be measured by a method of the type described in patent application US2013/0235649, which is herein incorporated by reference. Such a wear measurement method substantially comprises: reading the page for which the wear is desired to be measured and storing the read data in an intermediate storage element; writing in the highly resistive state (binary value '0') all the bits in the page; applying a bias voltage and measuring the sum of the currents flowing through the elementary cells of the page; and then rewriting into the page the data stored in the intermediate storage element. The sum or average value of the currents flowing through elementary cells of the page then forms an indicator of the wear of the page. Indeed, the higher the current, the lower the resistance of the cells in the highly resistive state, and the more the page is considered as worn. Such a measurement may be compared with that of other pages for the planning of a wear management method of the above-described type.

As a variation, the wear measurement method may comprise not only a first current measurement after the cells in the page have been programmed to the highly resistive state (binary value '0'), but also a second current measurement after the cells in the page have been programmed to the lightly resistive state (binary value '1'). In this case, the difference between the two read current values may form an indicator of the wear of the page. An advantage then is that the criterion of appreciation of the wear is representative of the resistivity difference between the highly resistive state and the lightly resistive state of the cells in the page, which is the quantity which effectively enables the cells to store data.

As a variation, a wear measurement method based on the following principles may be provided:

the current content of the page having its wear desired to be measured is used as a basis for the wear measurement, to avoid the step of writing all the bits in the page at a same value (contributing to the wear of the word); and the wear of the different bits in the page is appreciated individually, the page being considered as worn as soon as one of its bits has reached a critical wear threshold (which enables to detect wearing cases where a single bit in the page, or a small number of bits in the page, are used, while such cases could not be detected by prior methods of measuring the average current flowing through the page).

Such a method may for example comprise the successive steps of:

reading for a first time the content of the page having its wear desired to be measured with a standard current of discrimination between binary values '0' and '1' (that is, a threshold equal to the discrimination threshold used, in normal operating, during user read accesses), and recording the read value in an intermediate storage element;

reading for a second time the content of the page with a current threshold of discrimination between binary values '0' and '1' lowered with respect to the standard threshold, and comparing the read value with the value stored in the intermediate storage element by performing a bit-to-bit XOR between the two values; and if at least one of the output bits of the XOR is at binary value '1', deducing therefrom that the corresponding bit in the page is used.

It should be noted that the measured wear level then depends on the shift between the standard threshold of discrimination between binary values '0' and '1', and the lowered discrimination threshold used during the second reading. A number of read operations greater than two may be carried out by using different discrimination thresholds during the different read operations.

As an example, to analyze the wear of a memory segment, one may provide a method comprising a step of initializing, for example, at value 0, a counter of used pages of the segment, and then, for each page of the segment, the steps of:

a) reading for a first time the content of the page with a first threshold of discrimination between binary values '0' and '1' equal to the standard discrimination threshold, and storing the read value in an intermediate storage element;

b) reading for a second time the content of the page with a second threshold of discrimination between binary values '0' and '1' lowered with respect to the first threshold, and then comparing the read value with the value stored in the intermediate storage element by performing an XOR between the two values;

c) if at least one of the bits of the result of the XOR is at binary value '1', deducing therefrom that the page has an advanced wear level;

d) reading for a third time the content of the page with a third threshold of discrimination between binary values '0' and '1' raised with respect to the first threshold, and then comparing the read value with the value stored in the intermediate storage element by performing an XOR between the two values;

e) if at least one of the bits of the result of the XOR is at binary value '1', deducing therefrom that the page has an advanced wear level;

f) if the page is considered to have an advanced wear level after the second or the third reading, and if redundant pages are available in the memory, replacing the page with a redundant page, that is, reassigning to a redundant page the user address corresponding to the worn page;

g) if the page is considered as having an advanced wear level after the second or the third reading, and if no redundant page is available, starting the segment swapping machine to swap the content of the segment with that of a less worn segment, and stopping the segment wear analysis;

h) if the page is not considered as having an advanced wear level, reading for a fourth time the content of the page with a fourth threshold of discrimination between binary values '0' and '1' lowered with respect to the second threshold, and then comparing the read value with the value stored in the intermediate storage element by performing an XOR between the two values;

i) if at least one of the bits of the result of the XOR is at binary value '1', deducing therefrom that the page has an intermediate wear level lower than the above-mentioned advanced wear level;

j) then, reading for a fifth time the content of the page with a fifth threshold of discrimination between binary values '0' and '1' raised with respect to the third threshold, and then comparing the read value with the value stored in the intermediate storage element by performing an XOR between the two values;

k) if at least one of the bits of the result of the XOR is at binary value '1', deducing therefrom that the page has an intermediate wear level lower than the above-mentioned advanced wear level; and l) if the page is considered as having an intermediate wear level after the fourth or the fifth reading, incrementing the counter of worn pages of the segment.

When all the segment pages have been tested in this way, the value of the counter of worn pages of the segment is compared with a value of the number of worn pages previously determined and stored for this segment. If the new value is greater than the old value, the new value is stored and replaces the old value. If the new value of the number of worn pages is greater than a threshold, a mechanism of swapping of the content of the segment with the content of another less worn segment may be started or programmed. Otherwise, a mechanism of swapping of the contents of the pages within the segment may be started or programmed.

If a user reading occurs in the segment which is being analyzed, such a reading can be performed directly from the memory, given that the content of the segment is not affected by the wear analysis method.

However, if a user write operation occurs in a page being analyzed, the writing is performed both into the memory and into the intermediate storage element storing the content of the page. Thus, the intermediate storage elements used to implement the memory wear analysis method may in particular comprise an address register storing the address of the page being analyzed, to be able to compare this address with the address targeted by the user during a user write access.

It should be noted that steps d), e), j), and k) are optional. In other words, it may be done without reading the data with discrimination thresholds raised with respect to the standard threshold. Indeed, generally, the wear of a page essentially translates as a decrease in the cell resistance when the cell is programmed in the highly resistive state. Thus, the reading with a discrimination threshold lowered with respect to the standard threshold may alone be sufficient to detect worn cells.

Further, in the example of FIG. 4, a system comprising tables t1, t2 each comprising p 2-bit words, indicating whether a page of a segment in the process of being transferred has or not been transferred, has been described. As a variation, if the page transfer is performed in the increasing or decreasing order of segment addresses, tables t1, t2 may be omitted and a counter may be incremented for each page transfer. In a user access, the address targeted by the user may be compared with the value of the counter, to know whether the corresponding page has or not been transferred.

Further, the described embodiments are compatible with wear management methods aiming at "repairing" worn cells, or at robustly writing data into worn cells. Such a method may for example comprise alternately writing and deleting defective cells a plurality of times. As a variation or as a complement, a defective cell may be more or less partially regenerated by resetting the cell, that is, by applying thereto a programming voltage of same biasing as the voltage normally used to write into the cell in the lightly-resistive state, but of greater value, and for a time period which may be longer than the normal time taken to write into a cell.

As an example, when a defective word is identified (for example, by a wear measurement method of the above-mentioned type) or when an incorrect writing of a word is detected, a method comprising the following steps may be implemented.

a) Storing the content of the word and, possibly, its address, into an intermediate storage element.

b) Writing (that is, programming to the lightly-resistive state) and then deleting (that is, programming to the highly resistive state) the defective bits (during this step, it may be provided to only process defective bits, to avoid uselessly wearing out the other bits in the word).

c) Measuring the wear of the word, for example, via a wear measurement method of the above-mentioned type, or verifying whether the state of the cells identified as defective has become correct again.

d) If the identified cells are still defective, repeating steps b), c), and d). Otherwise, ending the repair method.

e) When the number of iterations of steps b), c), and d) reaches a threshold and cells are still defective, copying the entire segment containing the word into a redundant segment, and matching the user address for this segment with the physical address of the new segment.

f) Resetting the defective bits of the defective segment by applying thereto a programming voltage of same biasing as the voltage normally used to write into the cell in the lightly-resistive state, but of greater value, for a time period which may be longer than the normal time taken to write into a cell.

g) When all the defective bits in the segment have been reset, making the segment available in the list of redundant segments, and ending the repair method.

It should be noted that in the case where the defective cells are in the lightly-resistive state, the write and delete operations of step b) may be interchanged.

Such a repair method may for example be implemented by control circuit 403 of FIG. 4, or by any other adapted circuit. The different read and/or write steps of the repair method may be implemented during cycles dedicated to wear management, and thus be separated two by two by user accesses.

If a user access targeting a word in the process of being repaired occurs, this access may be performed in the intermediate storage element storing the content of the word or, if the defective word has been swapped with a word of a redundant segment, in the redundant segment which has become the new physical segment for the targeted data.

The invention claimed is:

1. A system comprising:
a memory comprising a plurality of pages;
intermediate data storage elements; and
a control circuit configured to perform user accesses to the memory and implement a memory wear management method, wherein the control circuit is configured to:
perform, between first and second consecutive operations of reading from or writing into a page of the wear balancing method, and between the second operation and a third consecutive operation of reading from or writing into a page of the wear balancing method, one or a plurality of user accesses to pages of the memory; and
on implementation of the wear management method, temporarily store content of the pages of the memory into said intermediate data storage elements as part of the wear management method and, when a read user access to a page of the memory occurs, verify whether content of the page targeted by the user is contained in said intermediate data storage elements and, if it is, read the content of the page directly in said intermediate data storage elements, and when a write user access to a page of the memory occurs, verify whether content of the page targeted by the user is contained in said intermediate data storage elements and, if it is, update the content of the page directly in said intermediate data storage elements.

2. The system of claim 1, comprising a counter or a table enabling the control circuit to know which memory addresses are being processed by the wear management method.

3. The system of claim 1, wherein the wear management method is a wear balancing method comprising data displacements resulting in modifying the physical address of the data within the memory.

4. The system of claim 3, wherein said intermediate data storage elements comprise first and second registers capable of each storing the content of a memory page.

5. The system of claim 3, wherein said intermediate data storage elements are volatile memory elements.

6. The system of claim 1, wherein the control circuit is configured to periodically insert wear management cycles between memory cycles reserved to user accesses, with the possibility of performing a read operation or a write operation of the wear management method at each wear management cycle.

7. The system of claim 1, wherein the control circuit is configured to perform said user accesses and said operations of reading from and writing into a page of the wear management method via a same access port of the memory.

8. The system of claim 1, wherein the control circuit is configured so that the consecutive read or write operations of the wear balancing method are separated by time intervals having the same duration.

9. The system of claim 8, wherein, in each of said time intervals, from fifty to ten thousand user accesses to memory pages may be performed.

10. The system of claim 1, wherein the memory comprises a plurality of portions of a plurality of pages each, the system comprising first and second tables capable of storing as many 2-bit inputs as a portion comprises pages.

11. The system of claim 1, further comprising an address conversion device configured to convert logic addresses, which are the addresses used by the user to access the content of the memory, into physical addresses, which are the addresses where the contents targeted by the user in the memory are effectively stored.

12. The system of claim 11, wherein the address conversion device comprises at least one counter or register configured to track shifts of pages within the memory or a portion of the memory.

13. The system of claim 1, wherein the memory is a resistive memory.

14. The system of claim 1, wherein the control circuit comprises a first sub-circuit configured to implement the wear balancing method, the first sub-circuit being integrated with the memory on a same semiconductor chip.

15. The system of claim 1, wherein the control circuit comprises a first sub-circuit configured to implement the wear balancing method, the first sub-circuit being integrated in a different integrated circuit chip than the memory.

16. The system of claim 1, wherein the wear management method comprises a wear measurement method comprising:
    a first step of reading from a page having its wear desired to be measured;
    a second step of reading from said page with a threshold of discrimination between binary values '0' and '1' modified with respect to the first step; and
    a step of bit-to-bit comparison of the values read during the first and second reading steps.

17. The system of claim 1, wherein the wear management method comprises a wear repair method comprising alternately writing and deleting, a plurality of times, into and from a memory cell deemed defective, and/or resetting this cell by applying thereto a voltage of same biasing as a voltage normally used to program this cell to the lightly resistive state, but of greater value.

* * * * *